(12) United States Patent
Roberts et al.

(10) Patent No.: US 10,721,020 B2
(45) Date of Patent: *Jul. 21, 2020

(54) PARITY FRAME

(71) Applicants: Kim B. Roberts, Ottawa (CA); Amir K. Khandani, Kitchener (CA)

(72) Inventors: Kim B. Roberts, Ottawa (CA); Amir K. Khandani, Kitchener (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/266,626

(22) Filed: Feb. 4, 2019

(65) Prior Publication Data

US 2019/0181977 A1 Jun. 13, 2019

Related U.S. Application Data

(63) Continuation of application No. 13/353,362, filed on Jan. 19, 2012, now abandoned, which is a (Continued)

(51) Int. Cl.
*H04L 1/00* (2006.01)
*H04B 10/61* (2013.01)
(Continued)

(52) U.S. Cl.
CPC ...... *H04L 1/0041* (2013.01); *H03M 13/2906* (2013.01); *H03M 13/373* (2013.01);
(Continued)

(58) Field of Classification Search
CPC ... H04L 1/0041; H04L 1/0057; H04L 1/0065; H03M 13/2906; H03M 13/373; H04B 10/61; H04B 10/50
See application file for complete search history.

(56) References Cited

U.S. PATENT DOCUMENTS 6,829,741 B1 * 12/2004 Khansari ............... H04L 1/0083
714/701
6,959,019 B2 10/2005 Roberts et al.
(Continued)

OTHER PUBLICATIONS

Esmaeili, "Acyclic Tanner Graphs and Maximum-Likelihood Decoding of Linear Block Codes", IEE Procedings, vol. 147, No. 6, Dec. 2000, pp. 322-332.
(Continued)

*Primary Examiner* — Kyle Vallecillo
(74) *Attorney, Agent, or Firm* — Integral Intellectual Property Inc.; Miriam Paton; Amy Scouten

(57) ABSTRACT

A super-frame for transmission in an optical communications system comprises two or more data frames and a parity frame. All frames in the super-frame have been encoded in accordance with a first Forward Error Correction (FEC) scheme. The parity frame is computed over the two or more data frames (prior to or concurrently with or after encoding via the first FEC scheme) according to a second FEC scheme. At a receiver, the super-frame is decoded in accordance with the first FEC scheme to generate a set of FEC decoded frames in which residual errors are clustered, that is, are non-Poisson. The second FEC scheme, which is particularly suited or designed to correct the clustered non-Poisson residual errors, is used to correct the residual errors.

19 Claims, 4 Drawing Sheets

Related U.S. Application Data continuation of application No. 15/250,553, filed on Aug. 29, 2016, now Pat. No. 10,200,149.

(51) Int. Cl.
  *H03M 13/29* (2006.01)
  *H03M 13/37* (2006.01)
  *H04B 10/50* (2013.01)

(52) U.S. Cl.
  CPC ........... *H04B 10/61* (2013.01); *H04L 1/0057* (2013.01); *H04L 1/0065* (2013.01); *H04B 10/50* (2013.01)

(56) References Cited

U.S. PATENT DOCUMENTS

| | | | |
|---|---|---|---|
| 7,149,432 B1 | 12/2006 | Smith et al. | |
| 7,522,841 B2 | 4/2009 | Bontu et al. | |
| 9,831,987 B2* | 11/2017 | Oveis Gharan | H03M 13/152 |
| 2002/0129313 A1* | 9/2002 | Kubo | H03M 13/2721 |
| | | | 714/752 |
| 2004/0153909 A1 | 8/2004 | Lim | |
| 2005/0204242 A1 | 9/2005 | Chou et al. | |
| 2006/0013342 A1 | 1/2006 | Rhee | |
| 2006/0093026 A1* | 5/2006 | Montojo | H04W 52/267 |
| | | | 375/225 |
| 2010/0088577 A1* | 4/2010 | Garcia | H03M 13/356 |
| | | | 714/776 |
| 2010/0115374 A1 | 5/2010 | Kirkby | |
| 2010/0153822 A1 | 6/2010 | Huang et al. | |
| 2011/0134908 A1 | 6/2011 | Almalki | |
| 2011/0222854 A1* | 9/2011 | Roberts | H04B 10/532 |
| | | | 398/70 |
| 2011/0252287 A1 | 10/2011 | Kure | |
| 2013/0007553 A1* | 1/2013 | Nishida | H04L 1/0009 |
| | | | 714/752 |
| 2013/0185614 A1 | 7/2013 | Shen | |

OTHER PUBLICATIONS

Miyata, et al., "Efficient FEC for Optical Communications using Concatenated Codes to Combat Error-floor", OFC/NIFOEC 2008.

Nonnenmacher, et al., "Parity-Based Loss Recovery for Reliable Multicast Transmission", IEEE/ACM Transaction on Networking, vol. 6, No. 4, Aug. 1998, pp. 349-361.

Vallecillo, First Office Action for U.S. Appl. No. 15/250,553, dated Feb. 12, 2018.

Vallecillo, Notice of Allowance for U.S. Appl. No. 15/250,553, dated Sep. 25, 2018.

\* cited by examiner

PARITY FRAME

CROSS-REFERENCE TO PRIOR APPLICATIONS

This application is a continuation of U.S. application Ser. No. 15/250,553 filed Aug. 29, 2016, now U.S. Pat. No. 10,200,149 issued Feb. 5, 2019, which is a continuation of U.S. application Ser. No. 13/353,363 filed Jan. 19, 2012. The contents of all of these applications are hereby incorporated by reference.

TECHNICAL FIELD

The present invention relates generally to optical communication systems, and in particular to systems and methods for error correction and data recovery in a coherent receiver.

BACKGROUND

In the field of data communications, it is well known that data can be lost or corrupted during transmission between a sender and a receiver. Typically, the reliability of the communications network is characterised by the Bit Error Ratio (BER), which measures the ratio of erroneously received bits (or symbols) to the total number of bits or symbols transmitted.

Various known methods are used to detect and correct data transmission errors, and thereby minimize the BER. These techniques normally fall into one of two categories, namely Automatic Resend Request (ARQ) and Forward Error Correction (FEC).

Automatic Resend Request (ARQ) techniques involve processing data at the receiver to detect erroneous or missing data. If such transmission errors are detected, an ARQ message is sent to request that the transmitter re-send the erroneous or missing data. In most packet networks any packet that has errors (CRC failure) at an intermediate node is deleted and not forwarded. These techniques suffer limitations in that they produce a large amount of control messaging between the transmitter and the receiver, and they require the transmitter to store in memory all of the data that it has transmitted, until the receiver confirms that the data has been successfully received. In high speed communications systems, the required memory in the transmitter becomes undesirably large, and the control signalling consumes an undesirably high amount of network resources. In addition, the round-trip delay experienced in sending an ARQ message and receiving a resent packet, can be undesirable in some applications.

Forward Error Correction (FEC) techniques involve processing the data prior to transmission, to generate parity (or check) symbols that may be used at the receiver to detect and correct erroneously received data. Well known FEC schemes include, but are not limited to, Turbo codes, Low-Density Parity Check (LDPC) codes, Block Turbo codes, Reed Solomon codes and BCH codes. For example, by adding T check symbols to a data frame being transmitted, a Reed Solomon code can detect up to T erroneous symbols in the receiver, and correct up to T/2 erroneous symbols in the received frame. An assumption of Reed Solomon encoding is that the errored symbols in the frame follow a Poisson distribution, that is, the probability that any given symbol is erroneous is equal to that of every other symbol, and is independent of any other symbol. As is known in the art, FEC techniques have an advantage that they avoid the need for storing and resending packets, and so avoid the above-noted problems associated with ARQ, but at a cost of increased overhead.

It is desirable to minimize the overhead, and have a very high noise tolerance, which has lead to the use of iterative sparse-graph FEC techniques such as Turbo codes and LDPC codes. However, these techniques suffer from a problem in that a decoded frame may contain residual errors that cannot be corrected by the selected FEC scheme. This problem may arise due to either channel effects (such as cycle slips) or limitations of the FEC algorithm itself, and normally affects a minority of the frames comprising a given signal. However, even when most of the frames are correctly decoded, a small number of decoded frames with significant residual errors can raise the BER of the signal as a whole. Within limits, the error-correction performance of iterative FEC techniques can be improved by increasing the number of iterations implemented by the decoder. However, there is a lower limit to the BER that can be achieved by these techniques, which cannot be further reduced by additional iterations. This lower limit is referred to as an "error floor". In the case of Turbo codes and LDPC codes, for example, error floors in the range of $10^{-4}$ to $10^{-10}$ are often encountered, which is unacceptably high for many users of optical transmission systems. Code designs that maximize error correction performance at high noise levels (low signal to noise ratio (SNR)) often raise the error floor. For high speed optical communications systems, hardware implementations of the FEC decoder are required, but this also raises the error floor.

Y. Miata et al. "Efficient FEC for Optical Communications using Concatenated Codes to Combat Error-floor", OFC/NFOEC 2008, describes the use of concatenation of a Reed Solomon code with an LDPC code to effectively eliminate error floors. This technique assumes that the errors remaining after the LDPC decoding step are small enough in number and follow a close enough approximation to a Poisson distribution that the Reed Solomon code will be capable of correcting them. However, in an optical communications system, cycle slips during carrier recovery can cause error bursts that are challenging for the FEC to correct. Under these conditions, the errored symbols remaining after the LDPC decoding are often too numerous and/or sufficiently non-Poisson that the concatenated Reed Solomon decoding provides very little real benefit.

J. Nonnenmacher et al. "Parity-Based Loss Recovery for Reliable Multicast Transmission", IEEE/ACM TRANSACTIONS ON NETWORKING, VOL. 6, NO. 4, August 1998 describes techniques which combine Forward Error Correction and Automatic Repeat Request (ARQ) to achieve scalable reliable multicast transmission. packet system. In this arrangement, packets are held in an ARQ buffer, and a parity packet is sent so that it can be used to recreate a missing packet without having to request retransmission of that missing frame. This arrangement allows a missing or dropped frame to be recovered at a receiver, and so reduces the number of re-transmission requests received by the multicast root node. However, a large ARQ buffer is still required in the root node, because the need to re-transmit lost packets is not eliminated entirely.

Techniques for data recovery that overcome limitations of the prior art remain highly desirable. In particular, it is desirable to have an error correction scheme for high speed optical transmission systems that has both very strong noise performance and a very low error floor.

SUMMARY

Disclosed herein are techniques for error correction and data recovery in an optical communications system.

A super-frame for transmission in an optical communications system comprises two or more data frames and a parity frame. All frames in the super-frame have been encoded in accordance with a first Forward Error Correction (FEC) scheme. The parity frame is computed over the two or more data frames (prior to or concurrently with or after encoding via the first FEC scheme) according to a second FEC scheme. At a receiver, the super-frame is decoded in accordance with the first FEC scheme to generate a set of FEC decoded frames in which residual errors are clustered, that is, are non-Poisson. The second FEC scheme, which is particularly suited or designed to correct the clustered non-Poisson residual errors, is used to correct the residual errors.

BRIEF DESCRIPTION OF THE DRAWINGS

Representative embodiments of the invention will now be described by way of example only with reference to the accompanying drawings, in which.

It will be noted that throughout the appended drawings, like features are identified by like reference numerals.

DETAILED DESCRIPTION

Figure 1:
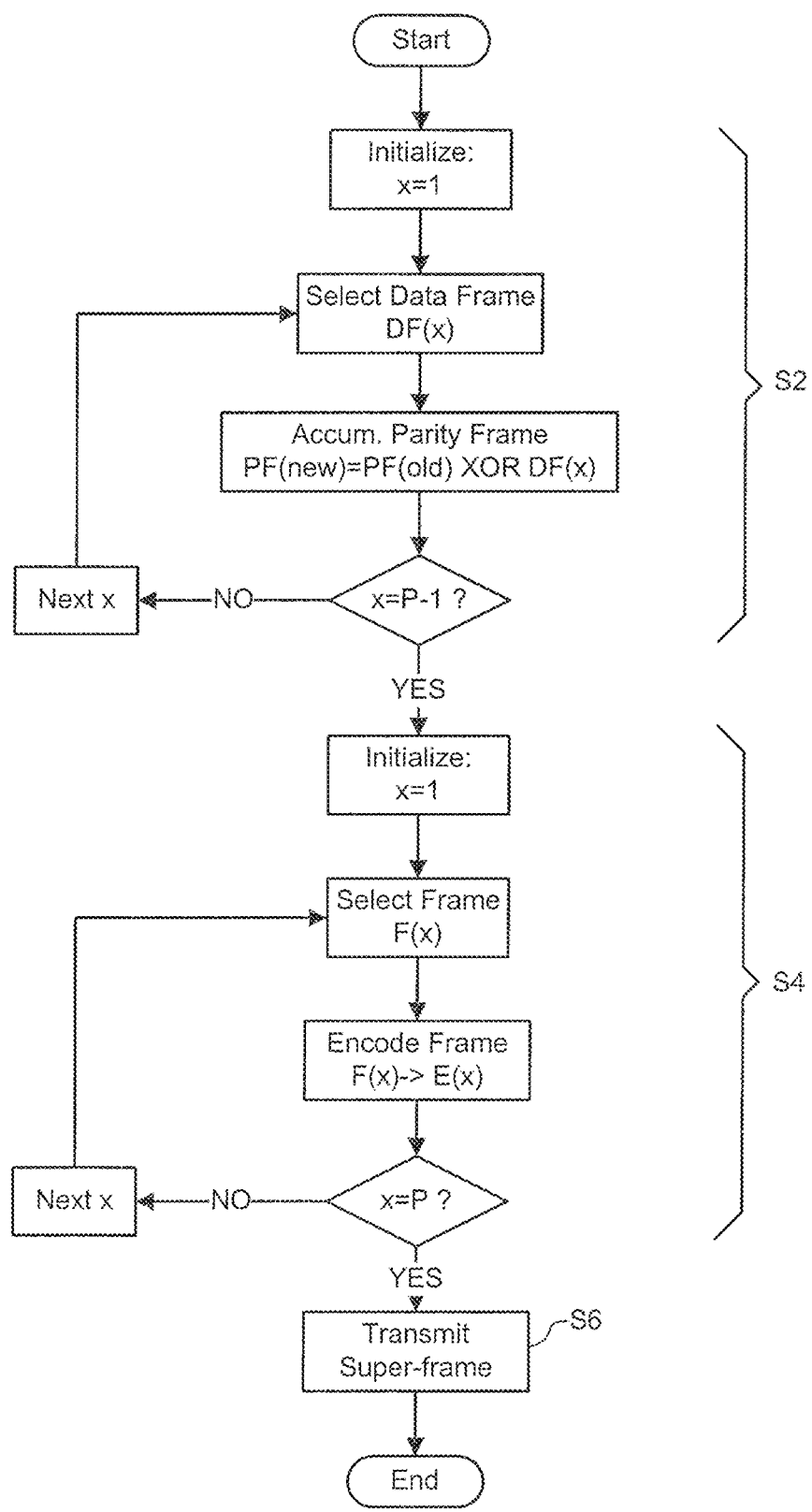
FIG. 1 is a flowchart illustrating representative steps in a process in accordance with an embodiment of the invention, implemented in a transmitter.

Error bursts after FEC can occur due to channel effects, or due to FEC algorithm limitations. The techniques described below exploit the observation that error bursts in an optical communications system will cause a FEC decoder to either fail to converge to a valid code word; or produce a decoded frame in which erroneous symbols are correlated in a manner that is characteristic of the specific FEC scheme that is being used.

In very general terms, there are provided techniques in which a first FEC scheme having a known error correlation characteristic is concatenated with a second FEC scheme which is selected based on the error correlation characteristic of the first FEC scheme. With this arrangement, a decoder in a receiver processes received frames using the first FEC scheme, on a per-frame basis, to yield FEC decoded frames in which the residual symbol errors are non-Poisson. The FEC decoded frames are then processed in accordance with the second FEC scheme to correct the residual symbol errors and so yield recovered data frames having a very low BER.

In one embodiment, the first FEC scheme is selected to have an error correlation characteristic such that an error burst due to channel effects will produce residual errors after FEC decoding that are clustered within one frame; and the second FEC scheme is selected such that it can correct 1 errored frame in a super-frame consisting of P (where P>1) frames, given P−1 correctly received frames.

Preferably, the first FEC scheme is selected to be strong enough that, in the absence of an error burst, a frame can be decoded to yield at least a moderately low residual BER. Known codes are capable of achieving this error correction performance. This means that a decoder implementing the first FEC scheme will either converge to a valid code word for a given frame, indicating with very high confidence that the received frame has been correctly decoded; or else it will fail to converge, indicating the presence of an error burst.

Various methods are known by which the effects of a cycle slip can be confined to a single block of symbols. For example, U.S. Pat. No. 7,522,841, which issued Apr. 21, 2009, in which an optical signal is composed of periodic SYNC bursts separated by blocks of data symbols. Since the symbol sequence and periodicity of the SYNC bursts are known, a cycle slip can be detected and its effects limited to the data symbols lying between the first slipped symbol and the next SYNC burst. With this arrangement, it is convenient to logically divide the signal into frames, with each frame comprising one or more SYNC bursts and an associated block of data symbols. This will have the effect of confining error bursts due to a cycle slip to the frame in which the cycle slip occurred. Thus, there is a high correlation in the pattern of residual bit errors.

For a given super-frame, the probability that more than one frame is lost (or corrupted) due to an error burst can be minimized by appropriate selection of the size of each frame and the number P of frames in the super-frame. In some embodiments, each frame may comprise 8$k$ bits, and the number P of frames in the super-frame may be 64, although this is not essential. With this arrangement, there is a very high probability that a decoder implementing the first FEC scheme will fail to converge to a valid code word for at most 1 frame in the super-frame. Consequently, a second FEC scheme in which a parity frame is computed over P−1 data frames can be used to correct (or reconstruct) the one errored frame in the super-frame, given that the other P−1 frames of the super-frame have been correctly decoded. For this single frame reconstruction, the parity frame can be computed by accumulating the bit-wise XOR of the P−1 data frames. In this case, any frame in the super-frame can be reconstructed in the receiver by accumulating the bit-wise XOR of the other P−1 (correctly decoded) frames of the super-frame.

FIGS. 1 and 2 respectively illustrate representative flow charts showing encoding and data recovery processes in accordance with the above-described embodiment. As may be seen in FIG. 1, each data frame DF(x) (x=1 . . . P−1) to be transmitted is processed (at step S2) to calculate the parity frame PF in accordance with the second FEC scheme, in this case as the bit-wise XOR of the data frames DF(x). Then, each frame F(x) of the super frame, consisting of the P−1 data frames DF(x) and the parity frame PF, is encoded (at step S4) using the first FEC scheme to produce corresponding FEC encoded frames E(x). The thus encoded super-frame can then be transmitted (at step S6) through an optical communications system.

Figure 2A:
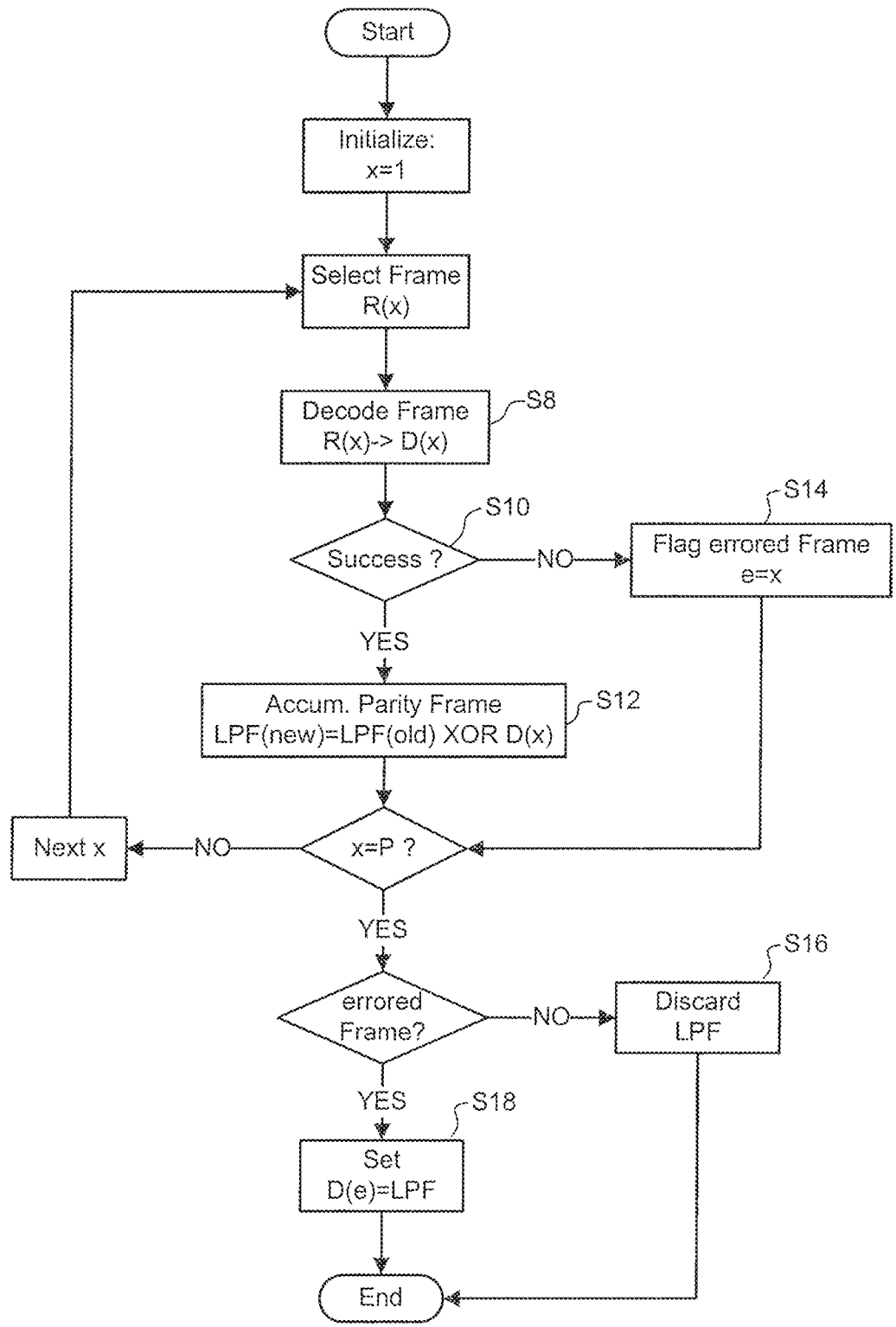
FIGS. 2A and 2B are flowcharts illustrating representative steps in respective alternative processes in accordance with an embodiment of the invention, implemented in a receiver.

Referring to FIG. 2A, in a receiver of the optical communications system, each received frame R(x) is processed (at step S8) in accordance with the first FEC scheme to generate corresponding decoded frames D(x). If this decoding step is successful (for example, the decoder converges to a valid codeword) at step S10, the decoded frame D(x) is retained, and used to calculate a local parity frame LPF in accordance with the second FEC scheme (at step S12), in this case as the bit-wise XOR of the decoded frames D(x). On the other hand, if the decoding step is unsuccessful, the errored frame is flagged (at step S14). Upon completion of the decoding step, if all of the frames have been correctly decoded, then the local parity frame (LPF) can be discarded (at step S16). Otherwise, the local parity frame (LPF) can be used to repair (or replace) the errored frame (at step S18). In the illustrated example, if the accumulated LPF is the bit-wise XOR of P−1 correctly decoded frames, then the content of the local parity frame in fact corresponds with the corrected content of the one errored frame. In this case, the errored frame can be corrected by substituting the LPF in place of the errored frame.

Figure 2B:
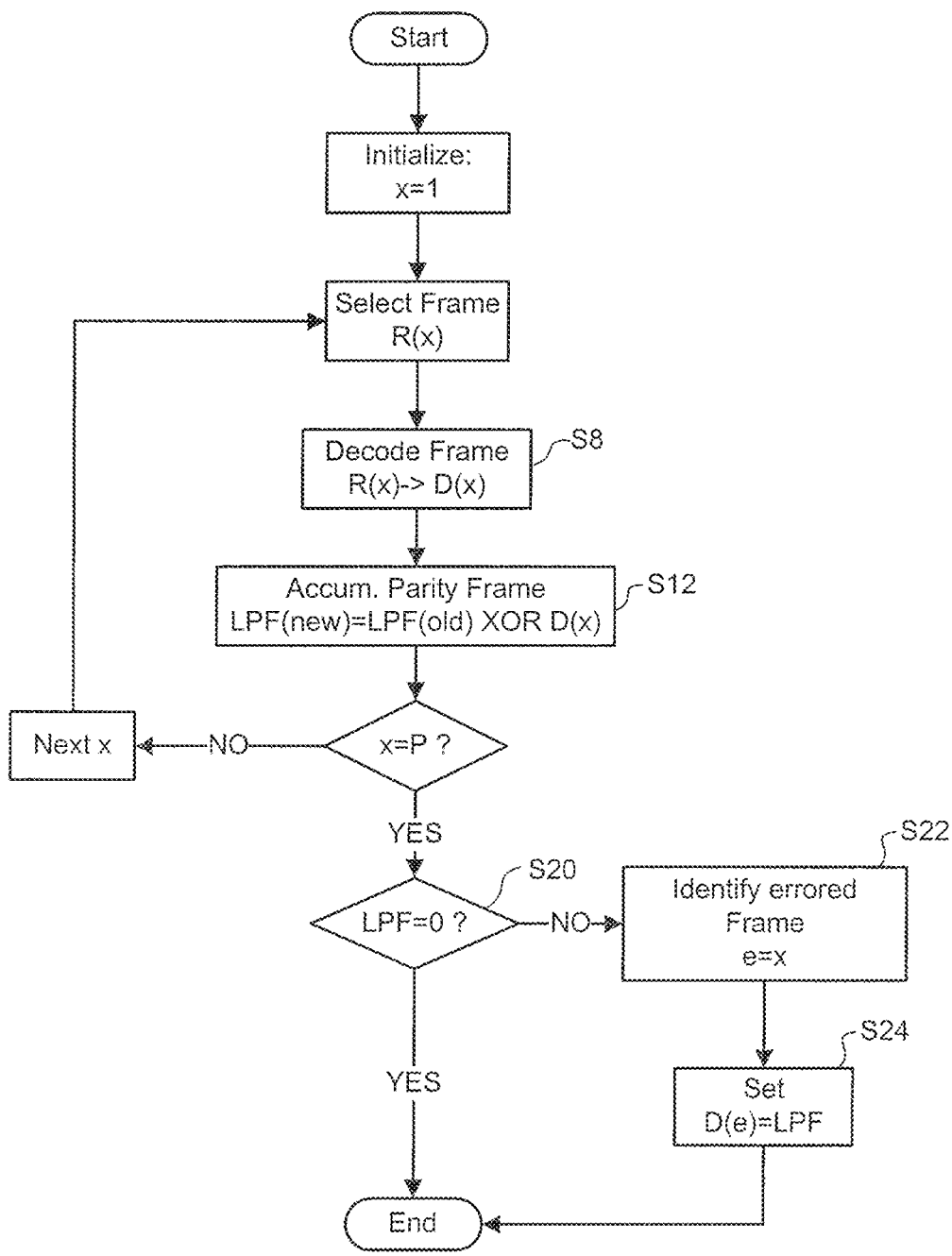

FIG. 2B illustrates an alternative process, in which the LPF is accumulated over all of the decoded frames D(x). Following the decoding and LPF accumulation steps (steps S8 and S12), the LPF is examined (at 20) to determine whether or not its value is zero. If the LPF=0, then all of received frames R(x) have been decoded successfully, and the decoding process ends. On the other hand, if the LPF does not equal zero, then at least one of the decoded frames D(x) was not successfully decoded. In this case, the errored frame D(e) is identified (at S22), and corrected using the LPF (at S24), in a manner directly analogy to that described above with reference to FIG. 2A.

In the foregoing description, the second FEC scheme corrects an error burst in a decoded frame by replacing the entire errored frame. This has an advantage in terms of simplicity of the algorithm, which in turn simplifies high speed hardware based implementations. However, if desired, more sophisticated FEC algorithms may be implemented, for example to replace a portion of an errored frame or to replace particular patterns of bits within the errored frame, in accordance with the known error correlation characteristics of the first FEC scheme.

In the foregoing description, the second FEC scheme is designed to correct one errored frame in a super-frame. These techniques can be extended to enable correction of error bursts affecting more than one frame.

For example, instead of calculating the Local Parity Frame LPF as the bitwise XOR of the correctly decoded frames, the LPF can be calculated to have "soft" values (more than two levels) indicating the probabilities of zero and one for each bit location in the frame. This may be referred to as a "soft metric" of each bit location. The soft metric can be an integer representing the log likelihood ratio, comprising a sign bit and a magnitude value. The magnitude value may be represented by two to six bits.

In order to recover errored frames, Maximum Likelihood (ML) decoding can be applied across the erroneous frames and soft syndromes, for example using coset decomposition and trellis decoding as discussed in Esmaeili, M.; Khandani, A. K.: "Acyclic Tanner Graphs and Maximum-Likelihood Decoding of Linear Block Codes"; IEE Proceedings, Vol. 147, No. 6, December 2000, the contents of which are hereby incorporated herein by reference.

More generally, one or more redundant (parity) frames can be computed to contain information about the number of 0's and 1's in each bit location (denoted by its index value) of the data frames or FEC encoded data frames of the super-frame. For example, two redundant frames can be added forcing the sum of bit values (0 and 1) across bits of the same index in each FEC frame to be zero modulo 3. Let us call this parity mod 3. Assume we detect two received frames being in error following FEC decoding. The bit pattern in these two erroneous frames (for any given index value) can be 00,01,10 or 11. In the case that the mod 3 parity is any one of, 00,10 or 01, then it can be shown that the two bits in error are 00,11 or 11, respectively. If the mod 3 parity is 11, the corresponding error pattern can be either 10 or 01 which is ambiguous. In such cases, the dependency between such two bits (the fact that such two bits are either 01 or 10) can be used to improve their corresponding soft metrics and then repeat the FEC iterative decoding for the erroneous frames.

For example, when the parity bit matches the XOR of the respective sign bits of the errored frames, the corresponding magnitude values could be doubled. When the parity bit does not match, then the magnitude values could be halved. Or, when the parity values do not match, the sign bit corresponding to the weaker magnitude is flipped.

Depending upon the FEC code structure being used, internal parities of that code can also be used in the calculation to select which of the two errored frames is trusted more.

After the soft metrics are adjusted, the FEC algorithm may then be executed on the two errored frames. If the decoder then converges to the valid codeword for one of these frames, then single frame correction, as described above, can be executed on the other.

This example uses a single parity calculation. Other coding can be used between frames, and the more complicated syndromes used in more insightful calculations upon greater numbers of errored frames. MDS codes are advantageous for this. Partial correction and guidance of the soft FEC can be done with shorter syndromes.

In the above-described embodiments, a bit-wise parity is calculated across the P−1 data frames of the super frame. However, this is not essential. Single parities could be calculated across more than one bit per frame, but at the cost of much less information and so much less capability for correcting errors. More complicated syndromes can be calculated across multi-bit symbols per frame, but again should only cover one symbol per frame for full performance.

The sets of P frames need not be transmitted contiguously. Indeed, while it is desirable that each frame be transmitted contiguously in order to increase the probability than a line event is contained within one frame, one could choose other transmission patterns.

The methods of U.S. Pat. Nos. 6,959,019 or 7,149,432, the contents of which are hereby incorporated herein by reference, could be used to reorder the bits.

The sets of P frames have been described as disjoint, for simplicity of implementation. They could be chosen to overlap.

The syndromes have been described as being calculated in parallel upon disjoint sets of bits, but could be intertangled, which effectively makes larger syndromes.

Frames can have a few extra overhead bits, or other bits that are not covered by the Soft FEC or not fully covered by the syndrome calculation.

While it is often advantageous for all frames to have the same length, frames can have unequal lengths if desired. A parity frame could have a different length than some data frames. The super-frame count, P, or the syndrome size can vary.

When linear codes are used for both the syndrome calculation and for the soft FEC, such as MDS and LDPC, BCH, or turbo codes, and the order of all of the symbols preserved, then the calculations are commutative. The syndromes could be calculated only on the data, and then the soft FEC calculated on the syndrome (parity) frame, or the soft FEC could be calculated first and then the syndromes calculated on all bits in the resulting frames. Either order produces the identical syndrome frame(s).

The first described example has soft FEC for the code in the frame and hard parities for the code across frames. Soft FEC could be used for both, with (Single Input Single Output) SISO processing of the inner code and the resulting metrics such as log likelihood values passed to the outer code.

The received frames do not need to be decoded in order. They can be done in parallel. Different frames may take different durations to decode. Once a sufficient number of received frames in one super-frame have been decoded correctly, the remaining data frame(s) can be reconstructed from the parity frame as described above. In some embodiments, reconstruction of one of more data frames in this matter may be more efficient than attempting to decode the corresponding received frame.

It will be appreciated that the methods described above may be implemented in an optical communications system by way of one or more signal processors, which may be constructed using any suitable combination of hardware and software. In high speed optical communications systems, it is contemplated that hardware implementations will be preferable. It is contemplated that, at the transmitter end of a link, the signal processor will normally take the form of (or be incorporated within) a FEC encoder, that is optimized to implement the encoding operations of the first and second FEC schemes. Similarly, it is contemplated that, at the receiver end of a link, the signal processor will normally take the form of (or be incorporated within) a FEC decoder, that is optimized to implement the decoding and frame reconstruction operations of the first and second FEC schemes.

Figure 3:
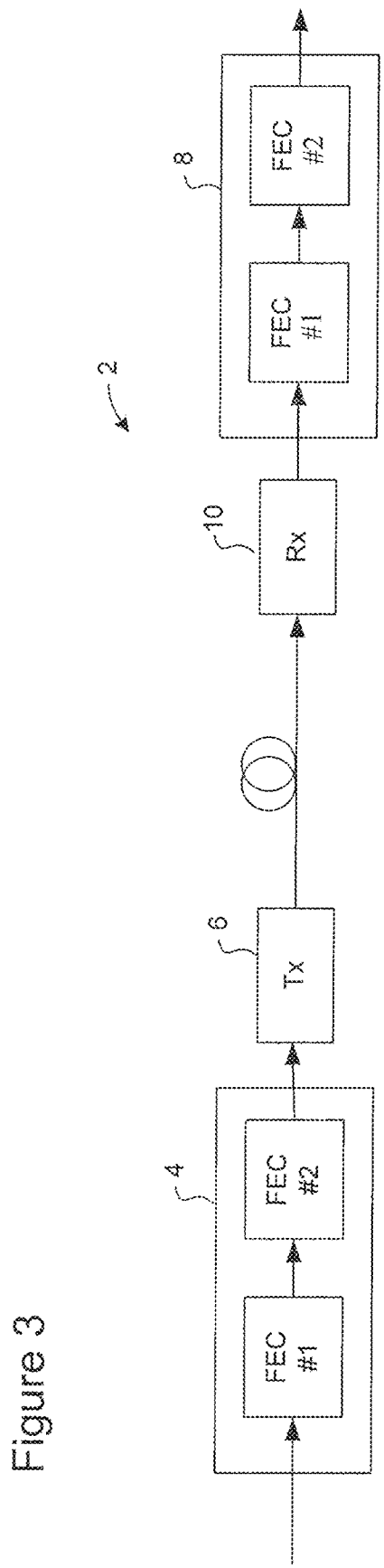
FIG. 3 schematically illustrates a representative optical communications system in which methods in accordance with the present invention may be implemented.

FIG. 3 schematically illustrates a representative optical communications system 2 of the type in which methods in accordance with the present invention may be implemented. As may be seen in FIG. 3, a FEC encoder 4 associated with a transmitter 6 may comprise a signal processor implementing the encoding operations of the first and second FEC schemes. Similarly, a FEC decoder 8 associated with a receiver 10 may comprise a signal processor implementing the decoding and frame reconstruction operations of the first and second FEC schemes. In principal, these signal processors may be implemented by a general purpose computer programmed using suitable software. However, using current technology, software-based solutions are expected to be too slow. Accordingly, in preferred embodiments, the signal processors are implemented entirely in hardware, for example using field Programmable gate Arrays (FPGAs) or Application Specific Integrated Circuits (ASICs). In some embodiments, the signal processor is implementing as two processor blocks pipelined together, such that one block is used to process frames using the first FEC scheme, and the other block is used to process frames using the second FEC scheme.

Although the invention has been described with reference to certain specific embodiments, various modifications thereof will be apparent to those skilled in the art without departing from the spirit and scope of the invention as outlined in the claims appended hereto.

What is claimed is:

1. A method of forward error correction (FEC) in an optical communications system, the method comprising:
   in a receiver signal processor of an optical receiver of the optical communications system
      decoding a super-frame from a received optical signal in accordance with a first FEC scheme to generate a first set of FEC-decoded frames having no residual errors and a second set of FEC-decoded frames, each of the FEC-decoded frames of the second set having plural residual errors, wherein the residual errors are clustered as a result of an error correlation characteristic of the first FEC scheme; and
      processing all of the FEC-decoded frames of the first set with a second FEC scheme to correct the plural clustered residual errors in one or more FEC-decoded frames of the second set.

2. The method as recited in claim 1, wherein processing all of the FEC-decoded frames of the first set with the second FEC scheme comprises calculating a local parity frame from all of the FEC-decoded frames of the first set.

3. The method as recited in claim 2, further comprising correcting the plural clustered residual errors in one of the FEC-decoded frames of the second set by replacing that one of the FEC-decoded frames of the second set with the local parity frame.

4. The method as recited in claim 2, wherein calculating the local parity frame comprises accumulating a bit-wise soft metric.

5. The method as recited in claim 1, the method further comprising:
   stopping the decoding of the super-frame when a number of FEC-decoded frames in the first set is sufficient that any remaining frames of the super-frame can be reconstructed using the second FEC scheme; and
   reconstructing the remaining frames using the second FEC scheme.

6. An optical receiver comprising:
   a receiver signal processor configured
      to decode a super-frame from a received optical signal in accordance with a first FEC scheme to generate a first set of FEC-decoded frames having no residual errors and a second set of FEC-decoded frames, each of the FEC-decoded frames of the second set having plural residual errors, wherein the residual errors are clustered as a result of an error correlation characteristic of the first FEC scheme; and
      to process all of the FEC-decoded frames of the first set with a second FEC scheme to correct the plural clustered residual errors in one or more FEC-decoded frames of the second set.

7. The optical receiver as recited in claim 6, wherein the receiver signal processor is configured to calculate a local parity frame from all of the FEC-decoded frames of the first set.

8. The optical receiver as recited in claim 7, wherein the receiver signal processor is configured to correct the plural clustered residual errors in one of the FEC-decoded frames of the second set by replacing that one of the FEC-decoded frames of the second set with the local parity frame.

9. The optical receiver as recited in claim 7, wherein the receiver signal processor is configured to calculate the local parity frame by accumulating a bit-wise soft metric.

10. The optical receiver as recited in claim 6, wherein the receiver signal processor is configured
   to stop the decoding of the super-frame when a number of FEC-decoded frames in the first set is sufficient that any remaining frames of the super-frame can be reconstructed using the second FEC scheme; and
   to reconstruct the remaining frames using the second FEC scheme.

11. An optical receiver comprising:
   a receiver signal processor configured
      to decode a super-frame from a received optical signal in accordance with a first FEC scheme to generate a set of FEC-decoded frames having residual errors, wherein the residual errors are clustered as a result of an error correlation characteristic of the first FEC scheme; and
      to use a second FEC scheme to correct the clustered residual errors, wherein the second FEC scheme is selected based on the error correlation characteristic of the first FEC scheme and is designed to correct the clustered residual errors, wherein the super-frame comprises FEC-encoded data frames and a single parity frame, the FEC-encoded data frames having been encoded in a transmitter signal processor of an optical transmitter from two or more data frames in accordance with the first FEC scheme, and the single parity frame having been computed in the transmitter signal processor across the two or more data frames in accordance with the second FEC scheme.

12. The optical receiver as recited in claim 11, wherein the receiver signal processor is configured to accumulate a bit-wise soft metric for use according to the second FEC scheme to correct the clustered residual errors.

13. The optical receiver as recited in claim 11, wherein the receiver signal processor is configured to use the single parity frame as decoded from the super-frame for use according to the second FEC scheme to correct the clustered residual errors.

14. The optical receiver as recited in claim 13, wherein the receiver signal processor is configured to replace an errored FEC-decoded frame with the single parity frame as decoded from the super-frame.

15. The optical receiver as recited in claim 11, wherein the receiver signal processor is configured to calculate a local parity frame from the set of FEC-decoded frames for use according to the second FEC scheme to correct the clustered residual errors.

16. The optical receiver as recited in claim 15, wherein the local parity frame is calculated only from FEC-decoded frames in which there are no residual errors.

17. The optical receiver as recited in claim 16, wherein the receiver signal processor is configured to replace an errored FEC-decoded frame with the local parity frame.

18. The optical receiver as recited in claim 15, wherein calculating the local parity frame comprises accumulating a bit-wise soft metric.

19. The optical receiver as recited in claim 11, the receiver signal processor configured
- to stop the decoding of the super-frame when a number of FEC decoded frames in which there are no residual errors is sufficient that any remaining frames of the super-frame can be reconstructed using the second FEC scheme; and
- to reconstruct the remaining frames using the second FEC scheme.

* * * * *